United States Patent
Woolger

(10) Patent No.: US 11,782,099 B2
(45) Date of Patent: Oct. 10, 2023

(54) MAGNETIC SHIELD DEVICE

(71) Applicant: Magnetic Shields Limited, Staplehurst (GB)

(72) Inventor: David Woolger, Staplehurst (GB)

(73) Assignee: Magnetic Shields Limited, Staplehurst (GB)

( * ) Notice: Subject to any disclaimer, the term of this patent is extended or adjusted under 35 U.S.C. 154(b) by 0 days.

(21) Appl. No.: 16/549,051

(22) Filed: Aug. 23, 2019

(65) Prior Publication Data

US 2020/0064428 A1   Feb. 27, 2020

(30) Foreign Application Priority Data

Aug. 24, 2018   (GB) ..................................... 1813886
Aug. 1, 2019   (EP) ..................................... 19189690

(51) Int. Cl.
| | |
|---|---|
| *G01R 33/00* | (2006.01) |
| *G01R 33/385* | (2006.01) |
| *G01R 33/3875* | (2006.01) |
| *G01R 33/421* | (2006.01) |
| *G01R 33/025* | (2006.01) |

(52) U.S. Cl.
CPC ....... *G01R 33/0076* (2013.01); *G01R 33/025* (2013.01); *G01R 33/385* (2013.01); *G01R 33/3875* (2013.01); *G01R 33/4215* (2013.01)

(58) Field of Classification Search
CPC .............. G01R 33/4215; G01R 33/385; G01R 33/3875
See application file for complete search history.

(56) References Cited

U.S. PATENT DOCUMENTS

| | | | | |
|---|---|---|---|---|
| 4,692,705 A | * | 9/1987 | Hayes | G01R 33/34046 324/318 |
| 4,725,781 A | * | 2/1988 | Roschmann | G01R 33/422 324/318 |
| 5,028,872 A | * | 7/1991 | Nakabayashi | G01R 33/421 324/318 |

(Continued)

FOREIGN PATENT DOCUMENTS

| | | |
|---|---|---|
| CN | 1877354 A | 12/2006 |
| EP | 1731917 A2 | 12/2006 |

(Continued)

OTHER PUBLICATIONS

J-H Storm et al: "A modular, extendible and field-tolerant multi-channel vector magnetometer based on current sensor SQUIDs", Superconductor Science and Technology, IOP Publishing, Techno House, Bristol, GB, vol. 29, No. 9, Jul. 14, 2016 (Jul. 14, 2016), p. 94001, XP020307904, ISSN: 0953-2048, DOI: 10.1088/0953-2048/29/9/094001.

(Continued)

*Primary Examiner* — Steven L Yeninas
(74) *Attorney, Agent, or Firm* — Giordano Law LLC; David A. Giordano

(57) ABSTRACT

A magnetic shield apparatus for shielding magnetic field probes. The shield apparatus comprises an outer shield, and an inner shield contained within the outer shield. A magnetic field sensor is housed in the inner shield, and the outer shield and the inner shield comprise a magnetically permeable material, enclosing a volume and having at least a first end that is open.

14 Claims, 5 Drawing Sheets

(56) References Cited

U.S. PATENT DOCUMENTS

| | | | | |
|---|---|---|---|---|
| 5,986,531 A * | 11/1999 | Carrozzi | G01R 33/422 | 324/318 |
| 6,424,853 B1 * | 7/2002 | Tsukada | A61B 5/242 | 600/524 |
| 7,259,570 B1 * | 8/2007 | Suzuki | G01R 33/0005 | 324/627 |
| 8,487,623 B2 * | 7/2013 | Penanen | G01R 33/0354 | 324/318 |
| 9,462,733 B2 * | 10/2016 | Hokari | G01R 33/025 | |
| 10,101,422 B2 * | 10/2018 | Rapoport | G01R 33/422 | |
| 2002/0050815 A1 * | 5/2002 | Suzuki | G01R 33/24 | 324/248 |
| 2002/0062076 A1 * | 5/2002 | Kandori | A61B 5/04007 | 600/409 |
| 2003/0218872 A1 * | 11/2003 | Tsukada | H05K 9/0077 | 361/816 |
| 2004/0263162 A1 * | 12/2004 | Kandori | G01R 33/0354 | 324/248 |
| 2005/0049491 A1 * | 3/2005 | Rezzonico | G01R 33/422 | 600/436 |
| 2005/0096531 A1 * | 5/2005 | Oonuma | A61B 5/04007 | 600/409 |
| 2006/0055402 A1 * | 3/2006 | Seki | A61B 5/061 | 324/262 |
| 2009/0256561 A1 * | 10/2009 | Ledbetter | G01R 33/282 | 324/305 |
| 2010/0219827 A1 * | 9/2010 | Matlashov | G01R 33/44 | 324/307 |
| 2011/0175616 A1 * | 7/2011 | Ochi | G01R 33/34076 | 324/318 |
| 2012/0176130 A1 * | 7/2012 | Ledbetter | G01R 33/26 | 324/301 |
| 2013/0229181 A1 * | 9/2013 | Biber | G01R 33/42 | 324/318 |
| 2014/0343397 A1 * | 11/2014 | Kim | A61B 5/05 | 600/409 |
| 2015/0145516 A1 * | 5/2015 | Ueda | G01R 33/3854 | 324/322 |
| 2016/0076924 A1 * | 3/2016 | Pusiol | G01F 1/74 | 324/306 |
| 2017/0120075 A1 * | 5/2017 | Overweg | A61B 5/055 | |
| 2018/0143274 A1 * | 5/2018 | Poole | G01R 33/34092 | |

FOREIGN PATENT DOCUMENTS

| | | |
|---|---|---|
| JP | H11128193 A | 5/1999 |
| KR | 20180020648 A | 2/2018 |

OTHER PUBLICATIONS

Prance R J et al: "Compact room-temperature induction magnetometer with superconducting quantum Interference device level field sensitivity", Review of Scientific Instruments, AIP, Melville, NY, US, vol. 74, No. 8, Aug. 1, 2003 (Aug. 1, 2003), pp. 3735-3739, XP012040989, ISSN: 0034-6748, DOI: 10.1063/1.1590745.

Min Jiang et al, "Experimental Benchmarking of Quantum Control in Zero-Field Nuclear Magnetic Resonance", arxiv.org, Cornell University Library, 201 Olin Library Cornell University Ithaca, NY 14853, (Aug. 21, 2017), XP080953842 [A] 1-14 * figure 1b *.

* cited by examiner

MAGNETIC SHIELD DEVICE

CROSS-REFERENCE TO RELATED APPLICATIONS

This application claims priority to and the benefit of European Patent Application No.: EP 19189690.1, filed Aug. 1, 2019 and titled "Magnetic Shield Device," which claims priority to and the benefit of United Kingdom Patent Application No.: GB 1813886.7, filed Aug. 24, 2018 and titled "Magnetic Shield Device." The contents of the above-identified Applications are relied upon and incorporated herein by reference in their entirety.

FIELD OF THE INVENTION

The present invention relates to magnetic shields, and particularly to magnetic shields in magnetic signal sensing applications.

BACKGROUND ART

Magnetic field probes are used to detect differential mode radiation emitted from a source. Sensitive probes, such as atomic magnetometer probes, are used in the detection of small magnetic fields. Small magnetic fields are important for various applications, including many emerging quantum technologies. Examples include the commercialization of atomic magnetometer probes with detection bandwidths and sensitivities suitable for biological and technical applications, including fully passive medical diagnostics of heart and brain currents and foetal heart pattern measurements; explosive detection inside metal enclosures, as proposed for airport security monitoring etc. (such as the Magnetic Vision Innovative Prototype, or "Magviz"); low-field NMR imaging; magnetic nanoparticle tracing; polarized noble gases for medical imaging of lung activity etc. In the case of medical imaging using atomic magnetometers, there is a focus on reducing the scale of the requisite apparatus from hospital-scale apparatus to medical practice scale, vastly enlarging the possible market. Other applications are found in fundamental science research.

Magnetometers with selected detection bandwidths and sensitivities can be used in explosive detection inside metal enclosures for airport security monitoring, for example, or magnetic nano-particle tracing. Magnetometers can also be used in medical imaging to measure heart and brain currents for medical diagnostic purposes. Low field Nuclear Magnetic Resonance (NMR) imaging is used in spectroscopy to obtain physical, chemical, electronic and structural information about materials and structures, and is commonly used in Magnetic Resonance Imaging (MRI) machines for research and medical diagnosis.

In NMR imaging, nuclei in a strong static magnetic field are perturbed by a weak oscillating magnetic field in the near field, and respond by producing an electromagnetic signal with a frequency characteristic of the magnetic field at the nucleus. This process occurs near resonance, when the oscillation frequency matches the intrinsic frequency of the nuclei, which depends on the strength of the static magnetic field, the chemical environment, and the magnetic properties of the isotope involved. The resonance frequency of a particular simple substance is usually directly proportional to the strength of the applied magnetic field.

Ultra-sensitive detectors such as Superconducting Quantum Interface Devices (SQuIDs) are commonly used for detecting ultra-weak magnetic fields emanating from the brain for passive measurement of neuronal activity in magnetoencephalopathy. Increasingly, SQuIDs are also used in ultra-low field magnetic resonance, functioning in a similar way to MRI machines. SQuIDs are able to probe chemical environments as well as provide images of tissue contrast as per traditional MRI machines. SQuIDs, however, utilise magnetic fields no stronger than the magnetic field of the earth so it is important for any local or environmental fields to be shielded from the immediate area of detection to reduce error and false readings.

SUMMARY OF THE INVENTION

The present invention therefore provides a magnetic shield apparatus, comprising an outer shield, and an inner shield contained within the outer shield, and a magnetic field sensor element contained within the inner shield, wherein the outer shield and the inner shield each comprise a surface of a magnetically permeable material, enclosing a volume and having at least a first end that is open, and the open end of the inner shield faces the surface of the outer shield.

In this way, the volume around the sensor does not need to be fully enclosed. We have found that the shielding only needs to produce a low field around the sensor, from which location the sensor can detect the field produced by an article being examined. The invention provides a shielding arrangement that allows samples to be inserted without opening and closing the enclosure.

We prefer that the outer shield and the inner shield each comprise an elongate member, the axis of the inner shield being arranged transverse to that of the outer shield. The axis of the outer shield is preferably substantially horizontal. Its open end is preferably partially closed, for at least partially obscuring the inner shield.

The surface of the inner shield can comprise an aperture, to allow fields outside the inner shield to reach the sensor.

A retaining means is useful, for retaining a magnetic field emitting sample adjacent the open end of the inner shield.

The magnetic shield can further comprise a compensation coil. This can be contained within the inner shield, ideally between the inner shield and the retaining means (if provided). The compensation coil can comprise a wire loop.

A pre-polariser coil can be provided outside the outer shield.

A coil for applying NMR pulses can be located within the outer shield.

The sensor element can be one that requires a holding field. It may be a single sensor, or an array of sensors.

The outer shield and the inner shield are preferably comprised of a permalloy or ferrite material, or other material having a high permeability.

BRIEF DESCRIPTION OF THE DRAWINGS

An embodiment of the present invention will now be described by way of example, with reference to the accompanying figures in which.

DETAILED DESCRIPTION OF THE EMBODIMENTS

The present invention provides a device to shield the immediate environment of magnetic field probes. The device provides easy access to the field probes from outside the shield so samples to be measured may be easily placed within range of the probe.

Figure 1:
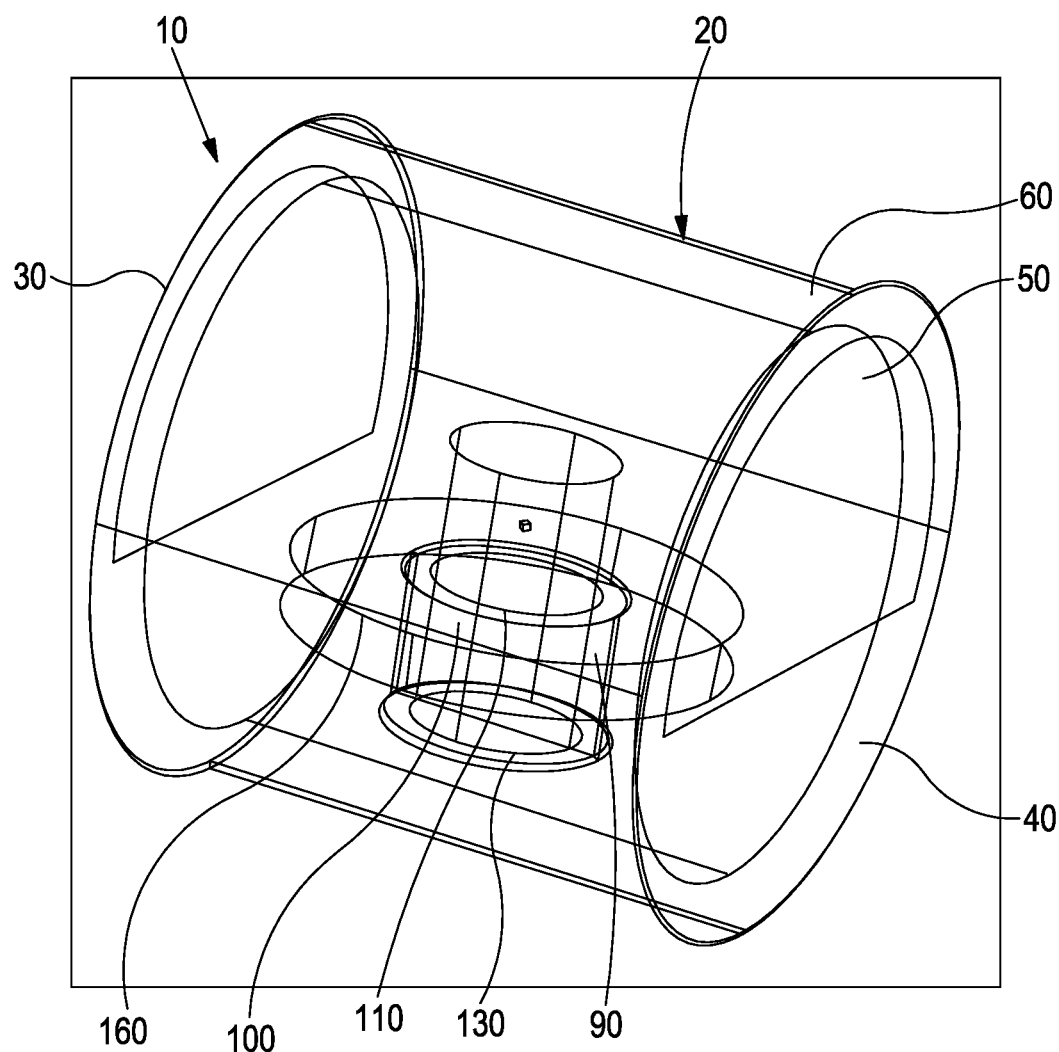
FIG. 1 shows a magnetic shield device.

FIG. 1 shows a magnetic shield device 10 comprising an outer shield 20 and an inner shield 90. The outer shield has a substantially cylindrical profile and, in the present embodiment, has a substantially horizontal axis. The outer shield 20 is open at a first end 30 and at a second end 40. The outer shield 20 has an inner skin 50 and an outer skin 60 joined at a first end 30 by end wall 30 and at a second end by end wall 40 to form a hollow body. In a preferred embodiment, the outer shield 20 has a length of 1 to 1.3 m. In the present embodiment, the outer shield has a preferred outer diameter of 1 to 1.3 m.

The inner shield 90 is contained within the outer shield 20 and is comprised of concentric cups and cylinders, depicted in the present embodiment as an outer skin 100 and an inner skin 110 joined to form a discrete element having tubular form to provide passive shielding. In a preferred embodiment, inner shield 90 has an internal diameter (on the inside edge of the flange) of 20 to 30 cm.

In alternative embodiments, both the inner shield 90 and the outer shield 20 may be provided in a squared, hexagonal, octagonal or other profile shape providing an enclosed surface to guide magnetic flux. The inner shield 90 may not have the same profile shape as the outer shield 20.

The inner shield 90 has a base 130 at one end, and an open end 120 at an end opposite the base 130. In a preferred embodiment, inner shield 90 has a depth of 10 to 25 cm. The inner shield is depicted as tubular in the present embodiment, but may be any elongate shape defining an internal volume.

The inner shield 90 has a longitudinal axis substantially perpendicular to that of the outer shield 20. The longitudinal axis of the inner shield 90 of the present embodiment is shown as substantially vertical. The base 130 is affixed to a portion of inner skin 50 of outer shield 20 at a location toward or at the axial centre of the outer shield 20. The inner shield 90 extends away from the base 130 toward a portion of the inner skin 50 opposite the portion to which the base 130 is affixed, to a distance less than the internal diameter of outer shield 20. The open end 120 of inner shield 90 faces inner skin 50 of the outer shield 20. In this way, the outer shield 20 protects the inner shield 90 from stray magnetic fields, particularly at the open end 120.

A compensation coil 160 is provided within outer shield 20. The compensation coil 160 is concentric to and arranged to extend concentrically around inner shield 90 to provide a compensation current to reduce the stray, residual or environmental magnetic fields in the region of the open end 120. In a preferred embodiment, the compensation coil 160 has a single turn with a 285 mA current.

The magnetic shield device 10 is formed of a permalloy or ferrite material. In a preferred embodiment, the magnetic shield 10 is Mumetal. However, the magnetic shield 10 may be formed any suitable material having a high permeability, including iron and nickel alloys. High permeability is defined as a permeability greater than that of soft iron ($\mu r>100$). In this embodiment, $\mu r$ is 10,000.

Figure 2:
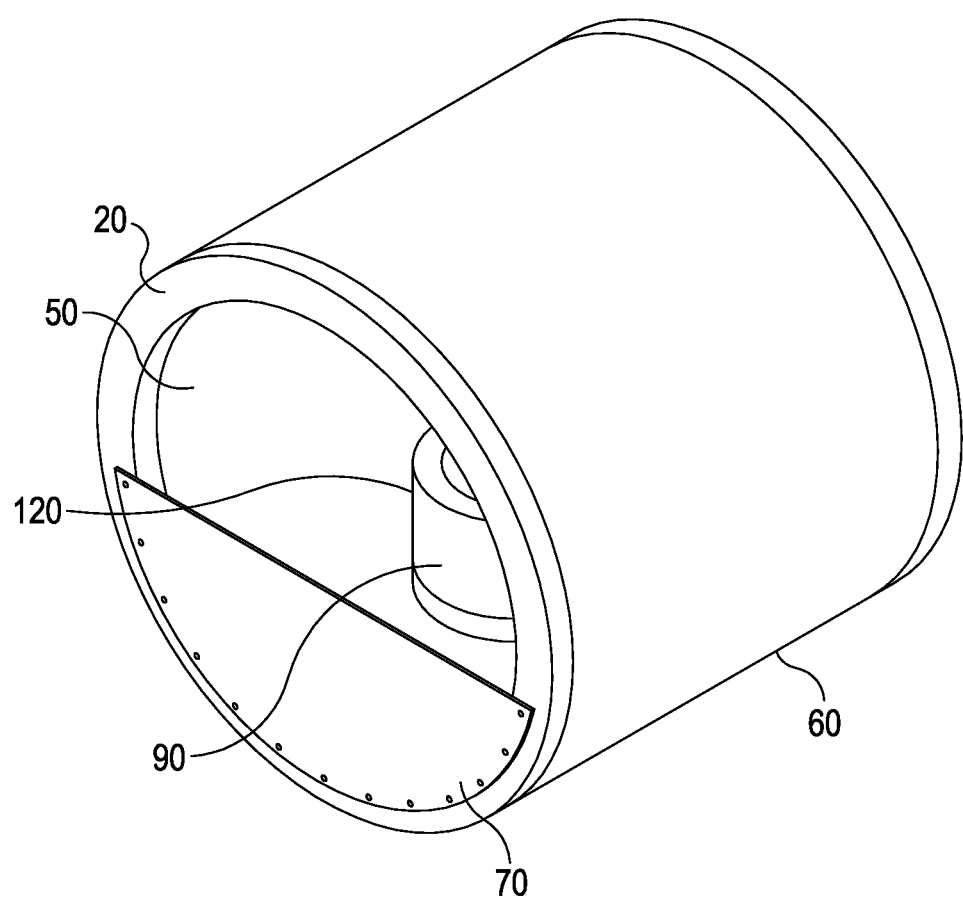
FIG. 2 shows an isometric view of a second embodiment of a magnetic shield device.

FIG. 2 shows a second embodiment of the magnetic shield device 10. In the second embodiment, the first end 30 of outer shield 20 is partially closed by section shield 70. The section shield 70 encloses a portion of the first end 30 adjacent the inner shield 90. The remaining open portion of first end 30 allows access to the open end 120 of inner shield 90. The section shield 70 is sized so that, when the magnetic shield device 10 is viewed along the longitudinal axis of the outer shield 20, a portion of the inner shield 90 adjacent the open end 120 is visible. The semi-closed ends formed by section shields 70, 80 provide additional shielding of outside fields whilst allowing samples to be inserted without the need for opening or closing the enclosure of the magnetic field device 10. The outer shield 20, along with the compensation coil 160, has an important function in isolating the sample 200 inserted within the magnetic shield device 10 from oscillating magnetic fields in the immediate environment to the magnetic shield device 10. This allows the magnetic shield sensor 150 within the magnetic shield device 10 to detect fields created by the sample 200 with minimal distortion or interference from fields originating outside the magnetic shield device 10. Providing an outer shield 20 with a length and diameter that are substantially equal enhances the shielding effect of the section shields 70, 80.

Figure 3:
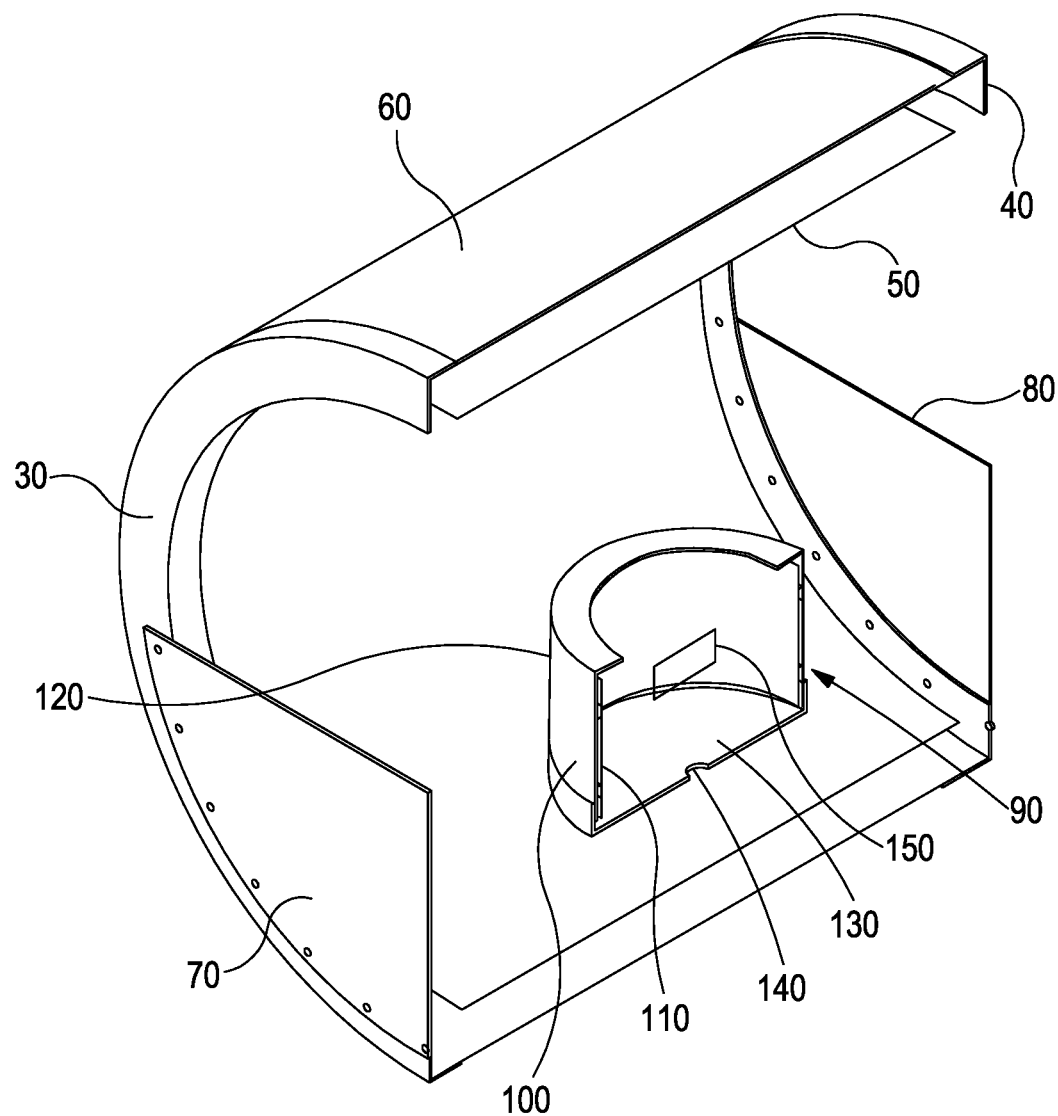
FIG. 3 shows a section view of the magnetic shield device of FIG. 2.

FIG. 3 shows a section view of the magnetic shield device 10 of FIG. 2, the section taken vertically along the longitudinal axis of outer shield 20. The section shield 80 partially closing second end 40 of outer shield 20 can be seen, arranged opposite section shield 70. The section shields 70, 80 enclose an area of outer shield 20 such that inner shield 90 is shielded from stray, residual or environmental magnetic fields entering first end 30 and second end 40 of outer shield 20.

The inside volume of the inner shield 90 houses a sensor 150 for detecting magnetic fields. The sensor may be a single sensor or an array of sensors. The inner shield 90 shields the inside volume housing the sensor 150 to a level of a few Nano-Tesla residual field. This is sufficient for operating atomic magnetometers.

In a preferred embodiment, the magnetic shield sensor 150 is an array of atomic Spin Exchange Relaxation Free (SERF) magnetometers placed in the shield for detecting electromagnetic signals. Atomic SERF magnetometers are suitable for detecting electromagnetic signals produced by a sample 200 comprised of the heart or brain of any animal or human. SERF magnetometers achieve increased sensitivity as compared to traditional atomic magnetometers by eliminating the dominant cause of atomic spin decoherence caused by spin exchange collisions in the vapour utilised to detect the magnetic field.

In a further preferred embodiment, the magnetic shield sensor 150 is an optical magnetometer. The noise characteristics "seen" by the optical magnetometers is different from that of other sensors as optical magnetometers do not have such a large bandwidth as SQuIDs, and are consequently less sensitive to high frequency noise. The shield may therefore be open rather than fully closed.

The strength of a magnetic field decreases at a rate that is inversely proportional to the third power of the distance from the magnetic field source. In the present embodiment, the compensation coil 160 around the inner shield 90 helps to operate the sensors 150 as the magnetic flux density in the target area is a linear function of the coil currents. Spatial integration of the sensors 150 helps avoid distortion and enables detection of signals in all directions. In such embodiments, the sensor 150 may, alternatively, be positioned on the surface of the inner shield 90, or above the inner shield 90, bringing the sensors closer to the signal emanated from the sample 200. The base 130 of inner shield 90 has an aperture 140 for degaussing the inner shield 90. The degaussing procedure for removing unwanted magnetism by decreasing or eliminating a stray, residual or environmental magnetic field is selected according to the degree of residual field desired or tolerated. Removing unwanted fields so that residual fields are below a nano-Tesla is possible.

The ability to degauss the inner shield 90 means the inner shield 90 and/or outer shield 20 may be profiled to provide an enclosed surface that is not cylindrical, such as a cuboid, hexagon or octagon, for example. The advantage of providing a shield assembly fabricated from flat sheets, and therefore having flat surfaces and corners, is that the shield has improved mechanical properties in the form reduced stress in the shielding material as compared to that of a shield formed using shape forming techniques. This improvement results in geometries easier to degauss, which results in smaller gradients, which are advantageous for sensor performance in the shield. In addition, access to the inside and disassembly of a non-cylindrical shield is practically easier, particularly where the dimensions of the shield are larger.

The inner shield 90 serves to shape the incoming stray flux, originating outside of the magnetic shield device 10, so that the stray flux does not reach the positions of the sensors.

Figure 4:
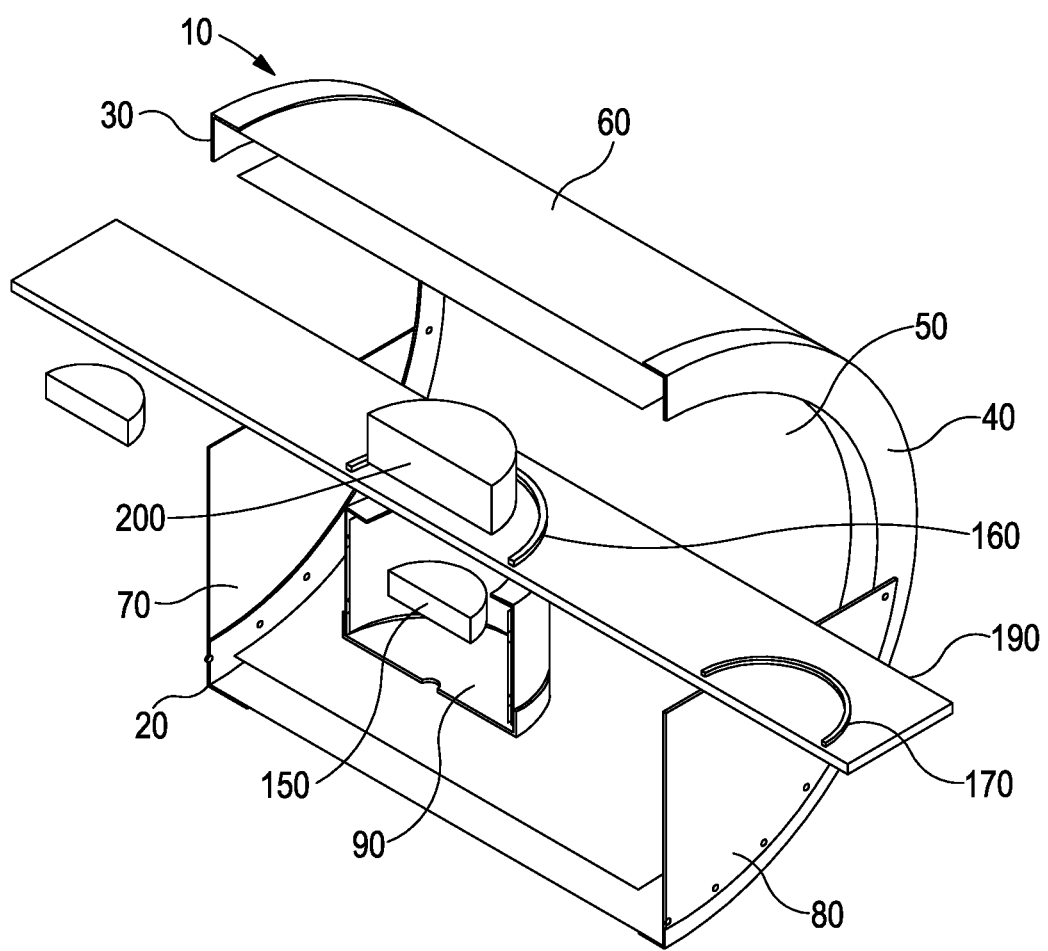
FIG. 4 shows the second embodiment of the magnetic shield device in a practical application.

FIG. 4 shows the second embodiment of the magnetic shield device 10 in practice. The magnetic shield is arranged around a bed or transport belt 190 that is substantially horizontal and extends longitudinally through the entirety of the outer shield 20, extending beyond each of the first 30 and second 40 ends. The mechanical supports supporting the transport belt are not shown. The transport belt 190 is positioned to lie above section shields 70, 80 and the open end 120 of the inner shield 90. The transport belt 190 in combination with section shields 70, 80 and a portion of the inner surface 50 of outer shield 20, creates an enclosure around inner shield 90. The open end 120 of inner shield 90 faces the underside of transport belt 190 in the region of the transport belt 190 for retaining a sample 200 to be measured.

A pre-polariser coil 170 for magnetising sample 200 is located closely below a transport belt in a portion of the transport belt 190 outside of the outer shield 20 adjacent the second end 40. Where the magnetic shield device 10 is used for low field Nuclear Magnetic Resonance measurements, the sample 200 is magnetised outside of the shield and subsequently transported by the transport belt 190 into the magnetic shield device 10 to the region of the transport belt 190 for retaining the sample 200 to be measured.

Where low field NMR measurements are taken, additional circular coils 180 for applying NMR pulses transverse to a holding field are required inside the magnetic shield 10. In embodiments of the magnetic shield device 10 suitable for low field NMR measurements, the holding field is generated by the compensation coil 160, with the additional circular coils 180 being coaxially aligned with the outer shield. In a preferred embodiment, the additional circular coils 180 are mounted between the inner skin 50 and the outer skin 60 of outer shield 20, between the first end 30 and the second end 40. The exact position is relatively flexible; current levels can be adjusted in the light of the exact position. In the example illustrated, a location for the coils is selected to avoid it interfering with the ability to place a sample within the shield. Alternatively, the holding field may be generated by wire loops (not shown) inside the inner shield 90 in a similar orientation to that of the compensation coil 160. The holding field and the pre-polarising field are arranged substantially perpendicular to each other to maximise NMR signal strength.

Figure 5:
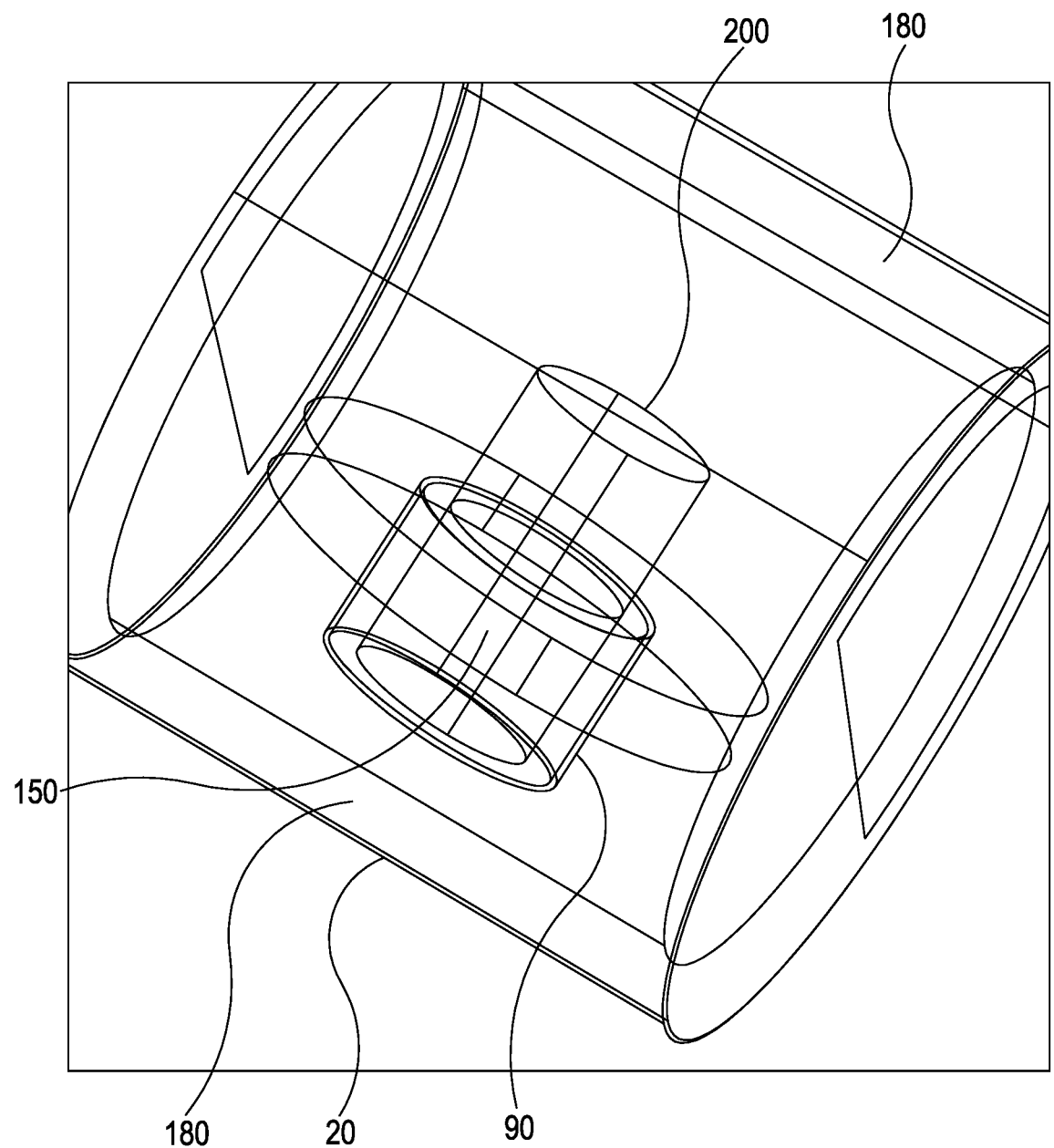
FIG. 5 shows the residual field distribution originating from the sample in the magnetic field device.

FIG. 5 shows an exemplary residual field distribution originating from sample 200. Each sample 200 has an independent field dependent upon structural and/or cellular make-up. Placing sample 200 on transport belt 190 adjacent inner shield 90 enables the fields from the sample 200 to reach the sensor 150 as the dipole, or magnetic signal, of the sample enters the inner shield 90 via open end 120. Although the magnetic signal of sample 200 is disturbed by the inner shield 90, the signal has a similar distribution to a signal that is undisturbed, so sensor 150 readings remain unaffected by the presence of the inner shield 90.

The magnetic shield device is based on an arrangement wherein only the sensor must be well shielded from stray, residual or environmental magnetic fields. It is then sufficient that the fields emerging from the sample, that are inherently independent from ambient fields, are the only fields that reach the sensor(s). Consequently, the outer shield can be a through-tunnel that permits continuous scanning in embodiments in which transport belt 190 conveys sample 200 from the exterior of magnetic shield device 10 to proximity with open end 120 of inner shield 90, and thus sensor 150, and beyond. However, batch process scanning is facilitated in embodiments in which a stationary bed 190 is selected.

It will of course be understood that many variations may be made to the above-described embodiment without departing from the scope of the present invention.

The magnetic shield device 10 is shown in FIGS. 1 to 5 as having an outer shield 20 with a substantially horizontal axis and an inner shield 90 having a substantially vertical axis. However, should the nature of the sample 200 and space available for the magnetic shield device 10 dictate, the outer shield 20 may have a substantially vertical axis and the inner shield 90 a substantially vertical axis. The magnetic shield device 10 may be arranged at any suitable angle or orientation for screening.

What is claimed is:

1. A magnetic shield apparatus, comprising:
   an outer shield and an inner shield contained within the outer shield, a magnetic field sensor element contained within the inner shield, and a transport belt extending longitudinally through the outer shield;
   a compensation coil which extends concentrically around said inner shield;
   wherein the outer shield and the inner shield each comprise a surface of a magnetically permeable material, enclosing a volume and having at least a first end that is open;
   wherein the open end of the inner shield faces the surface of the outer shield;
   wherein the open end of the outer shield is partially closed by a section shield for at least partially obscuring the inner shield; and
   wherein the transport belt is positioned to overlie the section shield and the open end of the inner shield, wherein the open end of the inner shield faces a portion of the transport belt.

2. A magnetic shield according to claim 1, wherein the outer shield and the inner shield each comprise an elongate member, the axis of the inner shield being arranged transverse to that of the outer shield.

3. A magnetic shield according to claim 2, wherein the axis of the outer shield is substantially horizontal.

4. A magnetic shield according to claim 1, wherein the surface of the inner shield comprises an aperture.

5. A magnetic shield according to claim 1, further comprising a retaining means for retaining a magnetic field emitting sample adjacent the open end of the inner shield.

6. A magnetic shield according to claim 1, wherein the compensation coil comprises a wire loop.

7. A magnetic shield according to claim 1, further comprising a coil for applying NMR pulses inside the outer shield.

8. A magnetic shield according to claim 1, wherein the sensor element is of a type that exclusively operates in the presence of a holding field.

9. A magnetic shield according to claim 1, wherein the sensor element is an array of sensors.

10. A magnetic shield according to claim 1, wherein the outer shield and the inner shield are comprised of a permalloy or ferrite material.

11. A magnetic shield according to claim 1, wherein said section shield partially obscures said compensation coil.

12. A magnetic shield according to claim 1, wherein said section shield at least partially obscures said inner shield in a fixed configuration.

13. A magnetic shield according to claim 1, wherein the magnetic shield further comprises a pre-polariser coil outside the outer shield.

14. A magnetic shield according to claim 1, further comprising at least one coil within said outer shield which applied an NMR pulse perpendicular to a holding field generated by said compensation coil.

* * * * *